United States Patent [19]

Lo et al.

[11] Patent Number: 5,626,276

[45] Date of Patent: May 6, 1997

[54] LINKAGE DRIVE MECHANISM FOR ULTRASONIC WIREBONDING

[75] Inventors: Jiann-Chang Lo; Michael Servedio, both of Boca Raton, Fla.

[73] Assignee: International Business Machines Corporation, Armonk, N.Y.

[21] Appl. No.: 616,127

[22] Filed: Mar. 14, 1996

[51] Int. Cl.$^6$ .................................. H01L 21/603
[52] U.S. Cl. .................................. 228/4.5; 228/45
[58] Field of Search .................... 228/1.1, 4.5, 45, 228/110.1, 180.5; 156/73.2; 219/56.21, 85.18

[56] References Cited

U.S. PATENT DOCUMENTS

| | | | |
|---|---|---|---|
| 3,357,090 | 12/1967 | Tiffany | 29/470 |
| 3,384,283 | 5/1968 | Mims | 228/1 |
| 3,401,861 | 9/1968 | Folk | 228/1 |
| 3,894,671 | 7/1975 | Kulicke, Jr. et al. | 219/85.18 |
| 3,941,294 | 3/1976 | Johannsmeier | 228/4.5 |
| 4,437,604 | 3/1984 | Razon et al. | 228/179 |
| 4,653,681 | 3/1987 | Dreibelbis et al. | 228/4.5 |
| 4,877,173 | 10/1989 | Fujimoto et al. | 228/1.1 |
| 5,201,453 | 4/1993 | Amador et al. | 228/110 |

*Primary Examiner*—Samuel M. Heinrich
*Attorney, Agent, or Firm*—Ronald V. Davidge; Richard A. Tomlin

[57] ABSTRACT

An ultrasonic wirebonding assembly, consisting of an actuator producing vibrations at an ultrasonic frequency and a tip transmitting such vibrations to a bonding wire atop a terminal to which the wire is to be bonded, is moved among positions on a circuit chip where wirebonding operations are to occur by means of a linkage. The linkage consists of first and second drive arms, each of which is pivoted on a single stationary shaft, a drive link pivoted on the second drive arm, and a connecting link extending between the drive link and the first drive arm, being pivoted at each end. Each arm is independently driven using a motor having a coil moving over an arcuate permanent magnet. The wirebonding assembly is driven vertically, downward in a direction of engagement with the workpiece and upward in a direction of disengagement with the workpiece, on the drive link by means of a linear motor. The rapid movements available from this linkage facilitate the use of an incrementally moving conveyer holding a number of circuit chips on which wirebonding operations are to be performed.

10 Claims, 6 Drawing Sheets

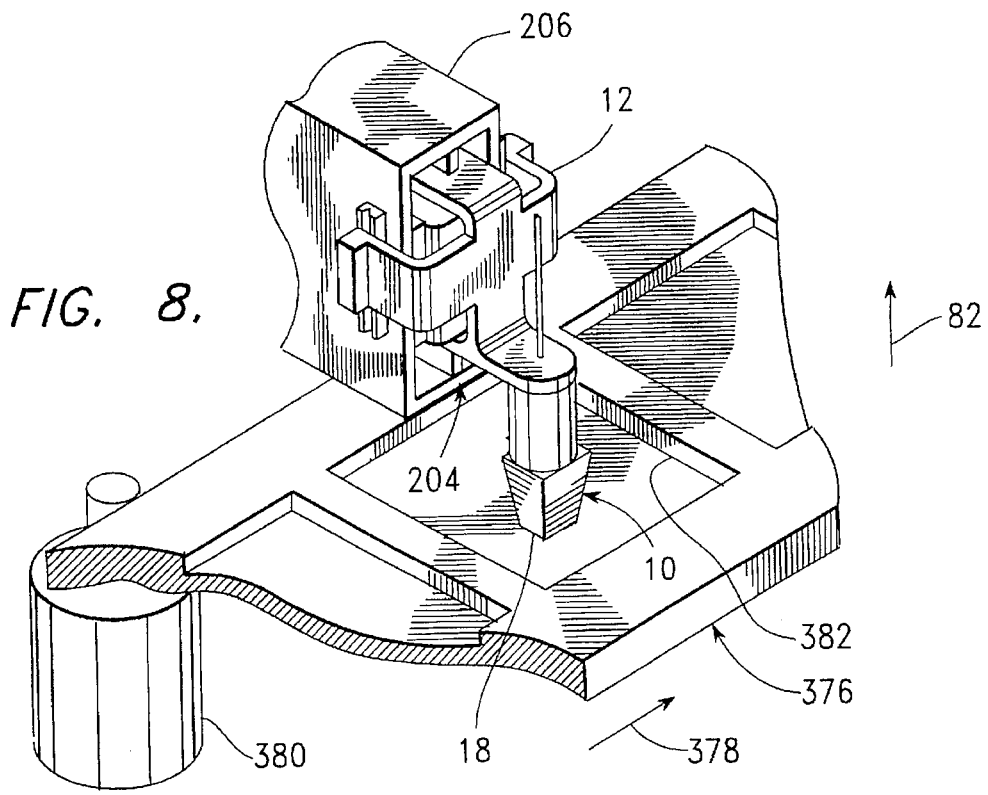
FIG. 8.
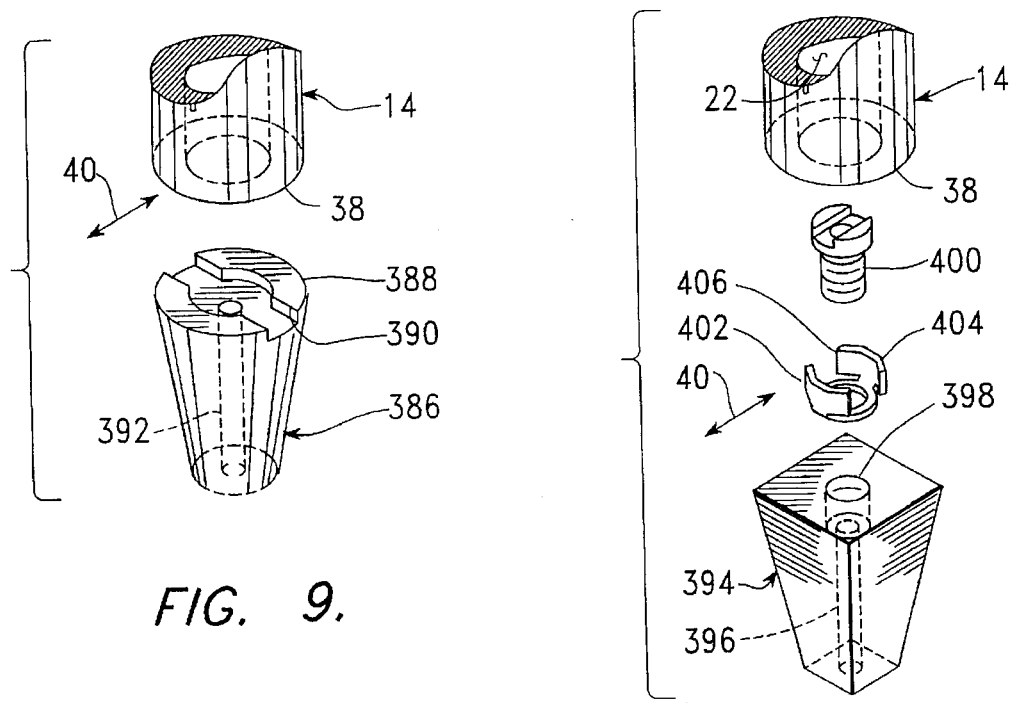
FIG. 9.
FIG. 10.

LINKAGE DRIVE MECHANISM FOR ULTRASONIC WIREBONDING

CROSS-REFERENCE TO A RELATED APPLICATION

This application is related by common inventorship and subject matter to a copending application filed on even date herewith, entitled "APPARATUS FOR WIREBONDING USING A TUBULAR PIEZOELECTRIC ULTRASONIC TRANSDUCER," Ser. No. 08/616,128, which is entirely incorporated herein by this reference.

BACKGROUND OF THE INVENTION

1. Field of the Invention

This invention relates to the production of integrated circuits, and, more particularly, to an apparatus for ultrasonically bonding external leads of a semiconductor integrated circuit to electrodes of the integrated circuit.

2. Background Information

Wirebonding is the most common technology used in the electronic packaging industry for making electrical connections between the electrode pads on an integrated circuit chip pellet and wires extending to a substrate providing external connections to the chip. Wirebonding is typically performed using ultrasonic bonding, thermocompression bonding, or thermosonic bonding. While ultrasonic wedge wirebonding is slower and more expensive than the other types, it currently becomes more popular because it can be performed at a lower temperature.

In ultrasonic wirebonding, the wire is typically fed through a hole extending through a bonding tip. The hold may extend centrally and axially downward through the tip, or it may extend at an oblique angle from an opening at a side of the tip to an opening in the distal surface of the tip. With conventional apparatus, ultrasonic vibrations are introduced into a proximal end of the bonding tip by means of an ultrasonic transducer through an ultrasonic horn. During the bonding process, the wire, extending from the distal end of the bonding tip, is pressed between the distal end of the bonding tip and the electrode of the circuit chip pellet. Thus, the bonding tip transmits ultrasonic vibrations between the ultrasonic horn and the wire, holds the wire in place, and presses the wire against the electrode, as required in the bonding process. With the wire firmly held in place, vibrations are applied at a typical frequency of 60 KHz with an amplitude of 2.5 microns.

In conventional ultrasonic wirebonding apparatus, vibrations are derived from the operation of a magnetostrictive transducer including a laminated metallic core composed of a magnetostrictive material, such as nickel, an excitation coil, to which an alternating frequency current is applied to produce the vibrations, and a polarizing coil, to which a direct current is applied. These vibrations are fed through an ultrasonic horn or coupling to the bonding tip, at which vibrations are transmitted to the wire being bonded. While such a transducer is readily able to produce the type of vibrations needed for wirebonding, it is necessarily large in size and mass.

Alternatively, the vibrations needed for wirebonding are conventionally produced using a stacked rectangular piezoelectric transducer. What is needed is a combination of an ultrasonic transducer which is small and light, and which has a center of gravity physically near the point at which bonding occurs, and a drive means which is also light and capable of rapid response.

Between wirebonding operations on an individual chip, either the wirebonding apparatus or the chip must be moved by a servomechanism, in order to traverse between the points at which wirebonding is to occur, and in order to bring the bonding tip into contact for the bonding process and out of contact for movement to the next point. If the wirebonding apparatus is to be moved, the wire, the bonding tip, and the ultrasonic transducer must be moved together, creating a significant mass which severely limits the speed at which the apparatus can be moved. This configuration physically separates the center of mass of the transducer from the distal end of the bonding tip, which must be accurately located at each bonding site, increasing the complexity of the dynamics associated with movement of the bonding tip. While the circuit chip being carried through the wirebonding process is much lighter than the wirebonding apparatus, moving the chip to traverse between wirebonding points while the wirebonding apparatus is held stationary places further burdens on the manufacturing process, since each chip must be loaded in a fixture to be moved separately, chips cannot be processed in a batch or as a part of a continuous flow.

Piezoelectric (piezoceramic) tube actuators have been used in a number of applications requiring the precise control of very small motions, such as the micropositioning for scanning tunneling microscopy.

What is needed is a wirebonding system in which circuit chips may be handled by means of a batch or continuous process, with the required movements among points for wirebonding being handled by moving the wirebonding apparatus, as the circuit chip is held still. Such a system needs a very light, and hence easily movable method for generating ultrasonic vibrations. It is also very desirable that the transducer producing the vibrations is located physically close to the distal end of the bonding tip, which must be accurately moved.

DESCRIPTION OF THE PRIOR ART

U.S. Pat. Nos. 3,357,090 to Tiffany and 4,877,173 to Fujimoto, et al., describe ultrasonic welding equipment including a bonding tip having an axial hole extending therethrough, through which a wire is fed for attachment to the surface of a semiconductor element, and a magnetostrictive transducer attached to a coupling member extending laterally from a side of the bonding tip. In such apparatus, the bonding tip is moved laterally, essentially parallel to the work surface to which the wire is attached, at an ultrasonic frequency, such as 60 KHz. The apparatus of Tiffany is particularly adapted for the attachment of a gold ball as well as for the attachment of a wire, with a cavity in the end of bonding tip being adapted to carry and position the ball. In the apparatus of Fujimoto, et al., the ultrasonic transducer and the bonding tip are coupled by an ultrasonic horn formed of a metallic material having a thermal coefficient of expansion of no more than about 0.000005 per degree C to limit locational errors due to thermal expansion. Both Tiffany and Fujimoto teach moving the semiconductor element on which bonding is being performed to traverse between positions in which bonding is to occur, and moving the bonding tip into and out of engagement.

U.S. Pat. Nos. 3,384,283 to Mims and 5,201,453 to Amador, et al., describe ultrasonic welding apparatus which produces vibrations within the bonding tip substantially perpendicular to the surface of the workpiece to which a wire is to be welded. The bonding tip includes an axial hole through which the wire is fed for bonding. The vibratory transistor is coupled to the bonding tip directly, or through a bifurcated coupling member, or "tuning fork," having the bonding tip and transducer attached to opposite tines, as shown particularly by Mims. The wire may be fed through a hole extending axially through a mounting plate, an ultrasonic transducer, a transducer mount, and the bonding tip, with the ultrasonic transducer and the bonding tip being coaxially aligned, as particularly shown by Amador, et al. Mims teaches the movement of the workpiece to traverse between the positions in which bonding operations are to occur, while Amador, et al., teach movement of the bonding apparatus for this purpose.

U.S. Pat. No. 4,434,604 to Razon et al. describes a method for making ultrasonic fine wire connections, using a capillary wedge bonding tool with an annular working face. The wire is fed through an axial hole in the bonding tip of an ultrasonic wirebonding tool. When the second bond is made, with a wire extending from a first bond to form an interconnection, the bonding tool is moved away from the second bond to leave a small portion of the wire exposed out of the bonding tool. The wire is clamped, and the bonding tool is moved away from the second bond to break the wire and to form a wire bonding tail. Movement of the bonding apparatus is used to traverse between the positions in which bonding operations are to occur.

While the patents described above teach either moving the workpiece or the bonding apparatus to traverse between bonding positions, the great size and mass of conventional ultrasonic transducers is not addressed. Again, what is needed is a light and compact mechanism for producing ultrasonic vibrations, which can be quickly moved between bonding points in a bonding apparatus.

SUMMARY OF THE INVENTION

In accordance with one aspect of the invention, there is provided apparatus for performing wirebonding operations on a circuit chip, with the apparatus including first and second drive arms driven in pivoting motions by first and second drive mechanisms, respectively, a linkage extending between the first and second drive arms, and a wire bonding assembly mounted on the linkage. The first and second drive arms are mounted to pivot about parallel axes. The linkage is pivotally attached to the first and second drive arms, being configured to allow independent movement of the first and second drive arms. The wirebonding assembly is mounted on the linkage, so that the pivoting movement of the first and second drive arms together move the wirebonding assembly within a two-dimensional region of movement. The wirebonding assembly is preferably mounted to slide on the linkage in and opposite an engagement direction, which is parallel the axes about which the drive arms pivot. Since the linkage is arranged to allow indepenent motion of the two pivot arms, and since such motion causes the movement of the wirebonding assembly within a range, such movement is used to move the wirebonding assembly among various positions in which wirebonding operations are to occur.

BRIEF DESCRIPTION OF THE DRAWINGS

FIG. 8 is a partial isometric view of the apparatus of FIG. 4, together with an indexing system used to present circuit chips to the apparatus for the wirebonding process and to hold circuit chips during the wirebonding process;

FIG. 9 is an isometric view of a first alternative bonding tip for the ultrasonic wirebonding assembly of FIG. 1, shown in an exploded relationship with an actuator thereof;

FIG. 10 is an isometric view of a second alternative bonding tip for the ultrasonic wirebonding assembly of FIG. 1, shown in an exploded relationship with an actuator thereof;

DETAILED DESCRIPTION

Figure 1:
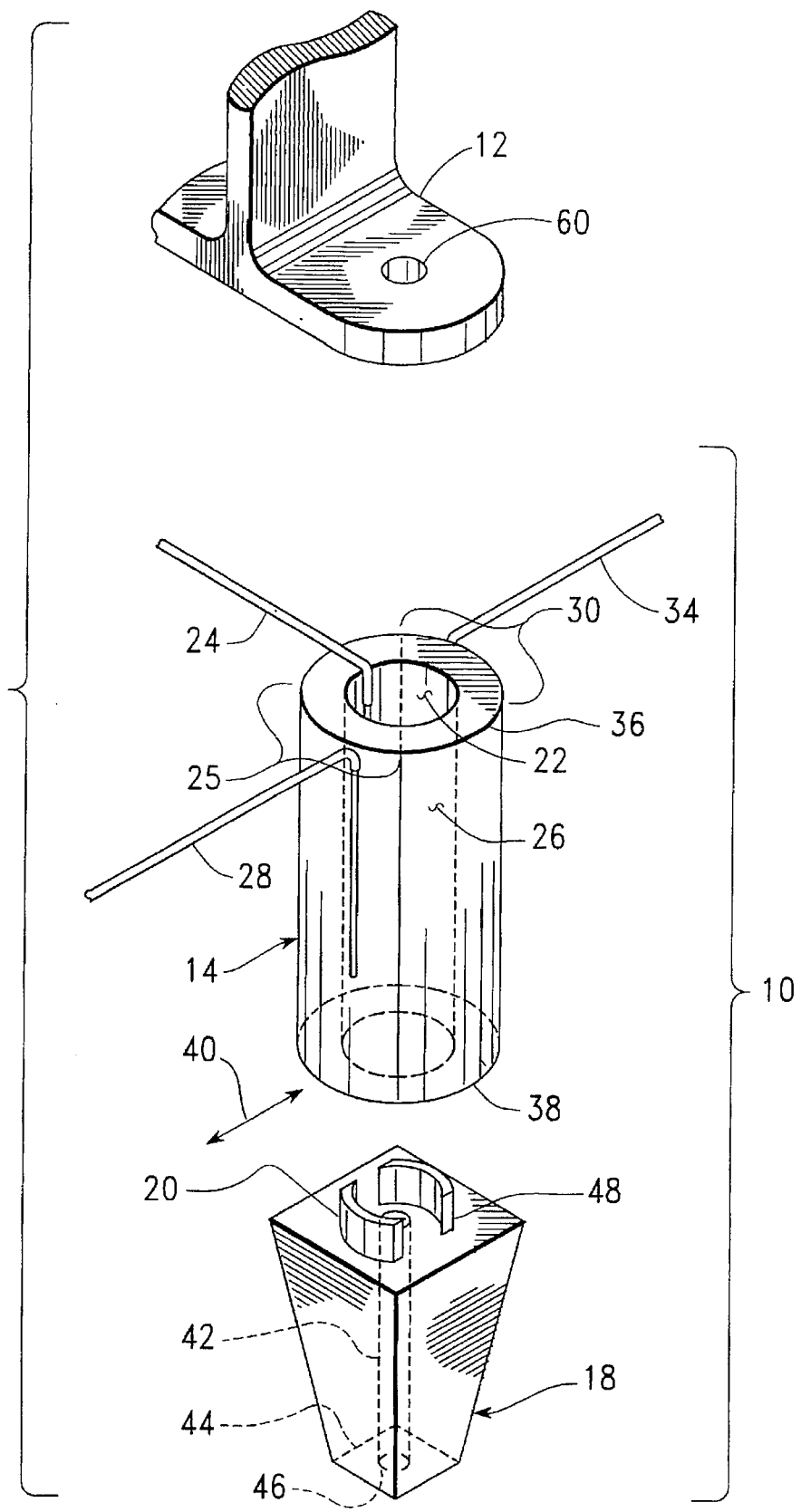
FIG. 1 is an exploded isometric view of an ultrasonic wirebonding assembly to be positioned by the present invention.

FIG. 1 is an exploded isometric view of an ultrasonic wirebonding assembly to be positioned by the apparatus of the present invention, shown with a portion of a slider 12. This assembly 10 includes a tubular piezoelectric actuator 14, adhesively attached to slider 12 by adhesive means, of an upper clamp 16, and a bonding tip 18, also adhesively attached to slider 12 at a lower clamp 20.

An inner surface 22 of piezoelectric actuator 14 is coated with a conductive inner coating connected to electrical ground by means of a ground wire 24. A first outer conductive layer 25, formed as a segment extending around a portion of outer surface 26, is connected to a first electrical signal by means of first signal drive wire 28. Similarly, a second outer conductive layer 30, also formed as a segment extending around a portion of outer surface 26, is connected to a second electrical signal by means of a second signal drive wire 34. Outer conductive layers 25 and 30 are on diametrically opposite sides of piezoelectric actuator 14. The remaining portions of outer surface 26 are not covered with a conductive coating.

A first AC signal at the desired ultrasonic frequency, such as 60 kHz, is applied to first signal drive wire 28, while a second AC signal, which is preferably equal to the first AC signal displaced in time by a phase angle of 180 degrees, is applied to second signal drive wire 34. Thus, as a positive voltage is applied to the first outer conductive layer 25, a negative voltage is applied to the second outer conductive layer 30, and vice versa. Due to the piezoelectric properties of the material composing actuator 14, the side of this actuator to which a positive voltage is applied shortens, while the side to which a negative voltage is applied lengthens. With the application of voltage signals in this manner, as the proximal end 36 of actuator 14 is held in place on slider 12, the distal end 38 thereof vibrates at the frequency of the applied signals on drive wires 28 and 34, in the directions indicated by arrow 40.

Bonding tip 18 has an axial hole 42 through which a bonding wire (not shown) is fed and a clamping surface 44 extending annularly around a distal end 46 of the axial hole 42. Lower clamp 20 is formed as an integral part of bonding tip 18, including a pair of opposing, upward-extending segments 48, which engage a distal portion of inner surface 22 to hold the bonding tip 18 in attachment with distal end 38 of actuator 14. A similar upper clamp (not shown) descends from carrier 12, including a pair of opposing, descending segments which engage a proximal portion of inner surface 22 to hold the upper clamp in attachment with proximal end 36 of actuator 14. Preferably, each pair of opposing segments is formed outward to provide an elastic gripping action upon insertion within inner surface 22. Preferably, this gripping action is reinforced by a chemical adhesive extending between the segments 48, 50 and the inner surface 22. A clearance hole 60 in upper clamp 16 allows a bonding wire (not shown) to be fed therethrough. Thus, the clearance hole 60 in upper clamp 16, the inner surface 22 of actuator 14, and the axial hole 42 in bonding tip 18, being coaxially aligned, provide a passageway through which a bonding wire (which will be discussed in reference to FIG. 2) is fed and guided.

Figure 2:
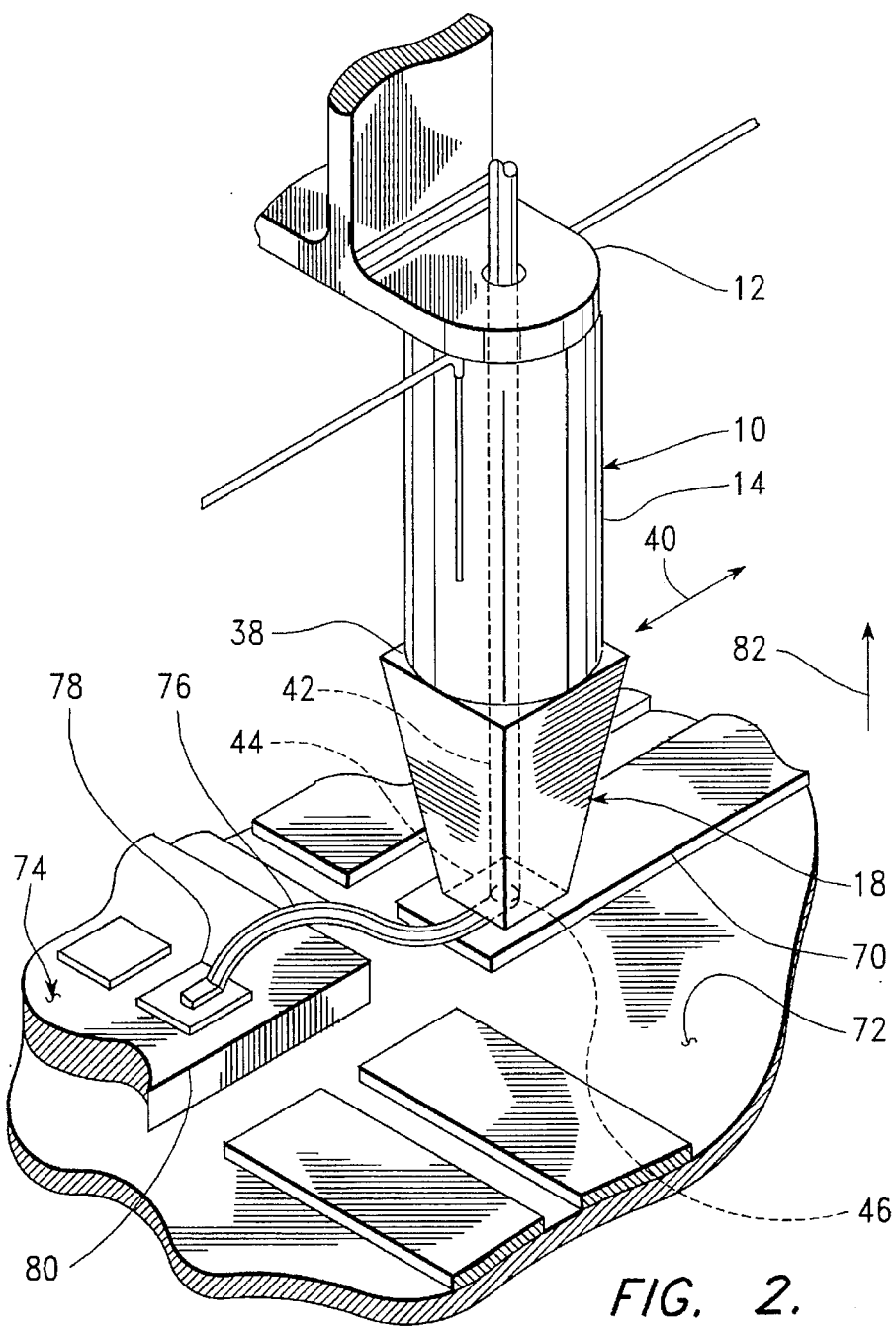
FIG. 2 is an isometric view of the ultrasonic wirebonding assembly of FIG. 1 forming a wirebond on a conductive pad of a semiconductor chip.

FIG. 2 is an isometric view of ultrasonic wirebonding assembly 10 performing a wirebond to a conductive terminal 70 on a substrate 72 of a circuit chip 74. In this example, a first portion of bonding wire 76 extends from a conductive pad 78 of the circuit chip 74, with a wirebond having been made to this pad 78 by means of the wirebonding assembly 10. This configuration is shown for illustrative purposes. Conductive pad 78 and conductive terminal 70 may be at different levels, as shown, in the vertical direction indicated by arrow 82, or they may be at the same level. Conductive terminals, such as terminal 78, may be mounted on a substrate, as shown, or may be held in frame (not shown). Heat may be applied to all or part of the circuit chip 74 and/or to the bonding wire 76 to facilitate a process know as thermosonic wirebonding, increasing the speed at which wirebonded connections are made.

The ultrasonic wirebonding assembly 10 is moved among the various points, such as conductive terminal 70 and conductive pad 78, at which connections are to be made, by means of the movement of slider 12. During such movement, wirebonding assembly 10 is held upward, in the direction of arrow 82, with bonding tip 18 out of contact with the various structures of circuit chip 74, by means of slider 12. When a wirebond connection is to be formed, wirebonding assembly 10 is lowered, with a portion of bonding wire 76 extending outward from distal end 46 of axial hole 42 in bonding tip 18, so that this portion of bonding wire 76 is clamped between clamping surface 44 of bonding tip 18 and a surface, such as conductive pad 78, to which a wirebonding attachment is to be made. As bonding wire 76 is held clamped in this way, the piezoelectric actuator 14 is electrically driven, as previously described in reference to FIG. 1, so that the distal end 38 thereof vibrates at an ultrasonic frequency in the directions indicated by arrow 40. Vibrations produced in this way are amplified by the additional length provided by bonding tip 18, and are transferred from clamping surface 48, through the portion of bonding wire 76 clamped thereby, to provide frictional heating at the junction between the bonding wire 76 and the conductive surface to which it is to be bonded. This frictional heat provides the ultrasonic bond.

When this wirebonding process is applied to a segment of bonding wire 76 to be attached between two conductive surfaces, such as conductive pad 78 and conductive terminal 70, after the first wirebonding is performed, the bonding wire 76 is allowed to pull through wirebonding assembly 10. After the second wirebond, a short length of bonding wire 76 is allowed to pull through wirebonding assembly 10 as the wirebonding assembly is moved away from the point at which wirebonding has occurred. Then, as the motion of the wirebonding assembly 10 continues, the bonding wire is clamped, by means which will be described in reference to FIGS. 4 and 5, so that the wire is broken near the wirebond, leaving a short length of bonding wire extending from the distal end 46 of hole 42, as needed to facilitate the next wirebonding operation. Additional movements of apparatus 10 and additional wirebonding operations are included in this sequence if a single wire segment is to be attached among three or more conductive surfaces.

Figure 3:
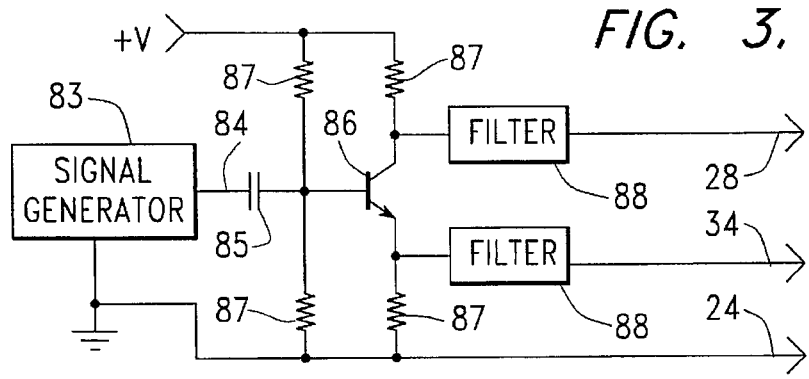
FIG. 3 is a schematic view of an electronic circuit used to drive an actuator in the ultrasonic wirebonding assembly of FIG. 1.

FIG. 3 is a schematic view of the electronic circuit used to generate the signals used to drive the piezoelectric actuator 14 (shown in FIG. 1). A signal generator 83 provides a oscillatory output signal, at the frequency chosen for driving the actuator 14, on line 84, which is coupled through a capacitor 85 to a unity-gain phase splitter including a transistor 86 and four resistors 87. As described in *The Art of Electronics*, by P. Horowitz and W. Hill, Cambridge University Press, 1989, page 77, the voltage V and the resistance values of the resistors 87 are set so that the quiescent collector voltage of transistor 86 is 0.75 Vcc. During operation of this circuit, the collector of transistor 86 can swing from 0.5 Vcc to Vcc, while the emitter can swing from ground to 0.5 Vcc. Filters 88 remove the steady-state effects of this transistor biasing, providing output signals on the lines 28 and 34 used to drive the outer conductive surfaces 25 and 36 of piezoelectric actuator 14 (all shown in FIG. 1), respectively. The inner conductive surface 22 (also shown in FIG. 1) of the actuator 14 is connected to electrical ground through line 24.

Figure 4:
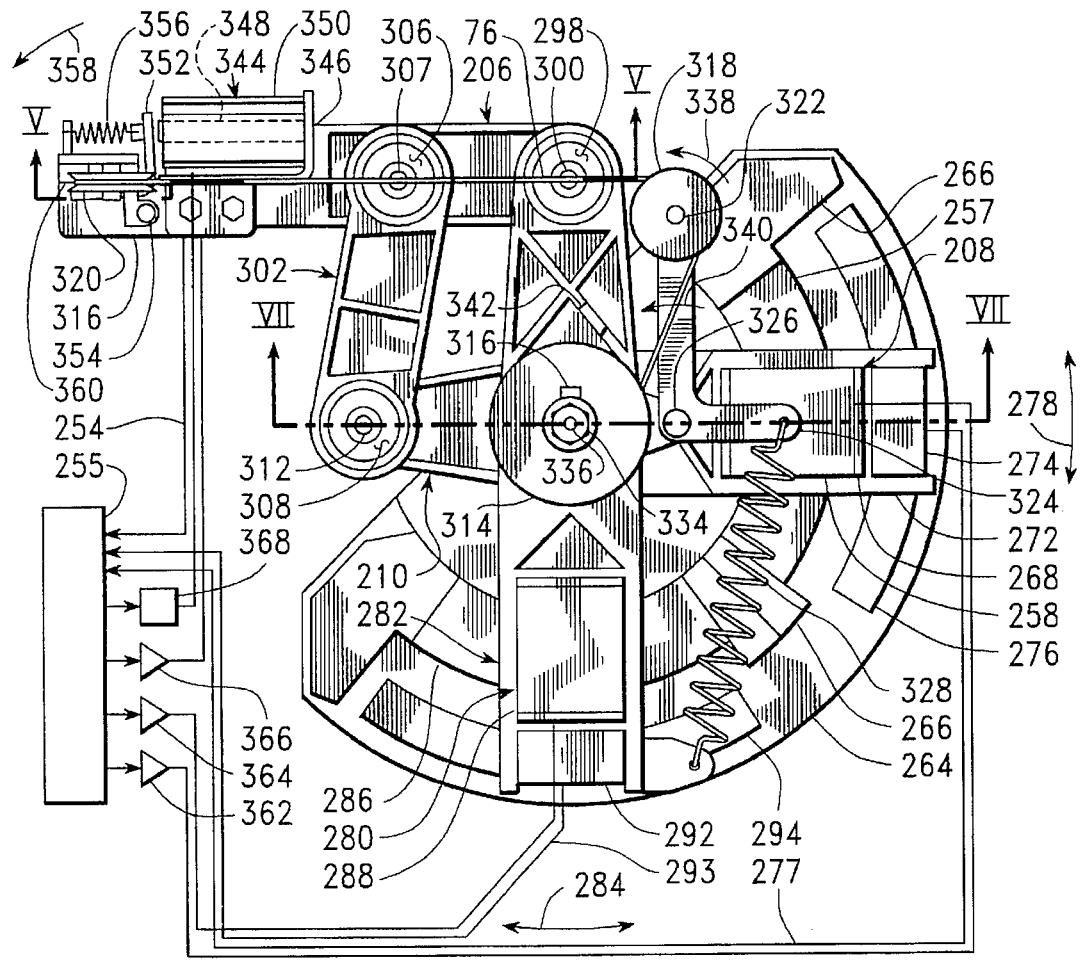
FIG. 4 is a plan view of apparatus built in accordance with the present invention to position the wirebonding assembly of FIG. 1 at various points at which wirebonding is to occur and to provide the engagement force necessary for wirebonding.
Figure 5:
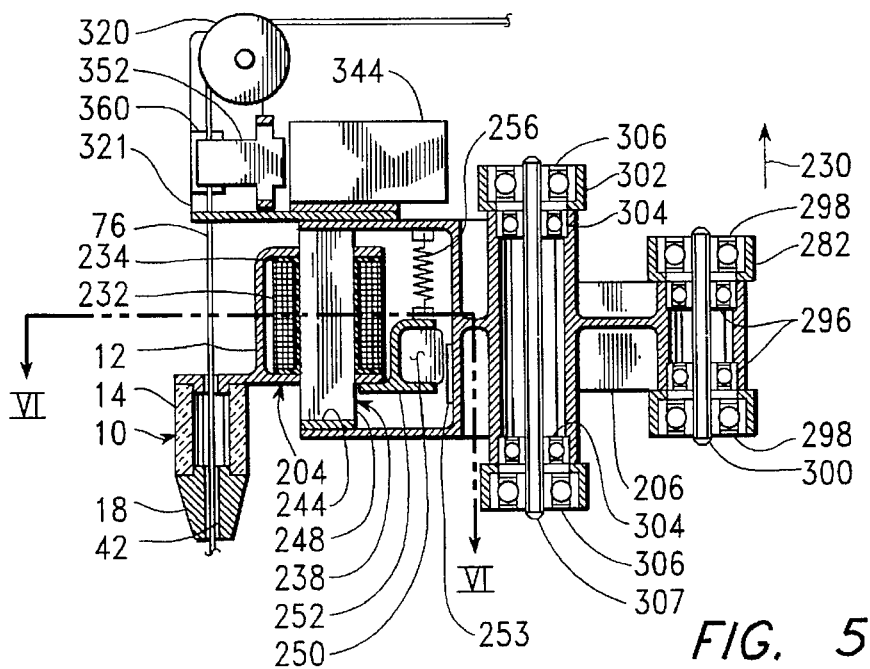
FIG. 5 is a partial vertical cross-sectional view of the apparatus of FIG. 4, taken as indicated by section lines V—V in FIG. 4 to show linkage pivots and the mechanism used to move a bonding tip into engagement with a workpiece.
Figure 6:
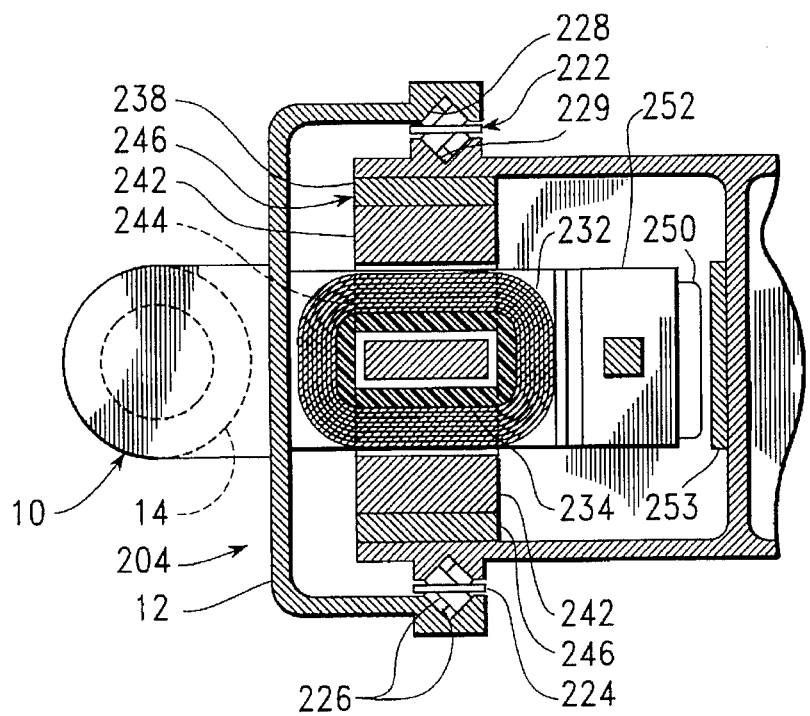
FIG. 6 is a partial horizontal cross-sectional view of the apparatus of FIG. 4, taken as indicated by section lines VI—VI in FIG. 5 to show a linear motor used to move the bonding tip into engagement with the workpiece.
Figure 7:
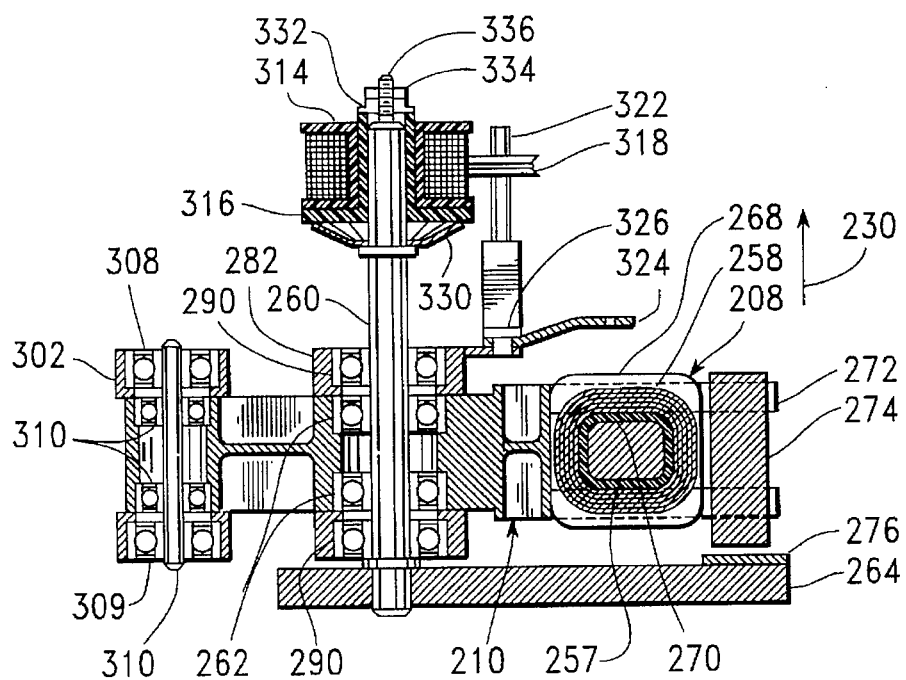
FIG. 7 is a partial vertical cross-sectional view of the apparatus of FIG. 4, taken as indicated by section lines VII—VII in FIG. 4 to show linkage pivots and one of two similar motors used to move the wirebonding assembly among points at which wirebonding is required.

FIG. 4 is a plan view of apparatus built in accordance with the present invention to position the wirebonding assembly of FIG. 1 at various points at which wirebonding is to occur, and to provide an engagement force necessary for the wirebonding process. FIG. 5 is a cross-sectional elevation, taken as indicated by section lines V—V in FIG. 4 to show a wirebonding assembly 10 and a linear motor 204 used to move the assembly 10 in a vertical direction, together with a drive link 206 mounting the motor 204. FIG. 6 is a partial cross-sectional plan view taken as indicated by section lines VI—VI in FIG. 5 to show the linear motor 204. FIG. 7 is a cross-sectional elevation, taken as indicated by section lines VII—VII in FIG. 4 to show an arcuate motor 208 used to move the wirebonding assembly 10 in a horizontal plane by means of a first drive arm 210.

Referring first to FIGS. 5 and 6, wirebonding assembly 10 is attached to a slider 12 forming an output portion of linear motor 204. Wirebonding assembly 10 includes a piezoelectric tube actuator 14, which may produce either ultrasonic vibrations along a horizontal line (parallel to the surface of the pad to which a wire is bonded), as described above in reference to FIGS. 1–3, or along a vertical line (perpendicular to the surface of the pad to which a wire is bonded), in a manner which will be described in reference to FIG. 11. Wirebonding assembly 10 also includes a wirebonding tip 18 having an axial hole 42 through which a bonding wire 76 is fed. The slider 12 is in turn slidably mounted on drive link 206 by means of a pair of crossed roller assemblies 222. Each crossed roller assembly 222 includes a retainer 224 rotatably mounting a number of rollers 226, which roll along the opposing surfaces of inward-facing V-shaped grooves 228 in slider 12 and outward-facing V-shaped grooves 229 in drive link 206. In this way slider 121 is slidably mounted to move vertically, in the upward direction of arrow 230 and opposite thereto.

Linear motor 204 also includes a coil 232 formed over a bobbin 234 so that individual turns of the coil are wound around a central aperture 236 of the bobbin 234. The coil 232 is mounted to move with slider 12, so that motions of the coil 232 are transmitted through the slider 12 to wirebonding apparatus 10. The stationary portion of linear motor 204 includes a frame 238, which is composed of a magnetic material such as electrical iron, and a pair of permanent magnets 242. Frame 238 includes a lower portion 244, extending transversely between a pair of upstanding end legs 246, and an upstanding central leg 248. The permanent magnets 242 are attached to extend inward from end legs 246, with each magnet 242 having a similar pole (such as a north pole) facing inward, toward coil 232, while the opposite pole faces outward, toward the surface of the adjacent end leg 246. The central leg 248 extends upward through the aperture 236 in bobbin 234. With this arrangement, when an electrical current is driven through coil 232, a force is established in the coil to move slider 12 upward, in the direction of arrow 230, or downward, opposite thereto. The force is proportional to the current flowing through the coil 232, and its direction is determined by the direction of current flow.

Continuing to refer to FIGS. 5 and 6, and referring additionally to FIG. 4, an optical sensor 250 is also fastened to slider 12, by means of a sensor bracket 252. This sensor 250 moves, with the slider 12, adjacent an optical scale 253, which is fastened to drive link 206. Data provided as an output of sensor 250 is fed along a line 254 to a port of a computing system 255, which uses an algorithm to determine the actual position of slider 12 in the vertical direction indicated by arrow 230.

An extension spring 256, extending between drive link 206 and sensor bracket 252 provides an upward force on slider 12 to ensure that the slider, and all the elements attached thereto, are held upward when no current is applied to flow through coil 232.

Referring to FIGS. 4 and 7, one of the devices moving wirebonding assembly 10 (shown in FIG. 5) in a horizontal plane (i.e. perpendicular to the direction of arrow 230) is first arcuate motor 208, which includes a stationary permanent magnet 257 and a coil 258 moving along an arcuate path with first drive arm 210, which is pivotally mounted on a stationary shaft 260 by means of a pair of bearings 262. Shaft 260 is rigidly attached to a base plate 264. Permanent magnet 257 is attached by means of a pair of mounting blocks 266 to extend above base plate 264 in a spaced-apart relationship therewith. The permanent magnet 257 is magnetized to have a single pole (such as a north pole) extending along its upper surface and the opposite pole extending along its lower surface. The coil 258 is wound over a bobbin 268, including a central aperture 270, through which permanent magnet 257 extends.

Bobbin 258 is held in place on first drive arm 210 within four outward extending posts 272 forming part of the arm 210. With this arrangement, when an electrical current is driven through coil 258, a force is established within the coil 258 to move the drive arm 10 rotationally about stationary shaft 260. This force, and hence the torque acting on first drive arm 210 from the coil 258, is proportional to the current flowing through coil 258, and the direction of this force is determined by the direction of current flow within coil 258.

An optical sensor 274 is also fastened to first drive arm 210, being directed at an arcuate optical scale 276 extending along base plate 264. Data provided as an output of sensor 274 is fed along a line 277 to an input port of the computing system 255 which uses an algorithm to determine the actual position of first drive arm 210 in the directions indicated by arrow 278.

The other device moving wirebonding assembly 10 (shown in FIG. 5) in a horizontal plane is a second arcuate motor 280 driving a second drive arm 282 in the directions indicated by arrow 284. This motor 280, which includes a permanent magnet 286 and a coil 288, is similar or identical to the previously-described motor 208. The second drive arm 282 is pivotally mounted on stationary shaft 260 by means of a pair of bearings 290. A second optical sensor 292 is mounted on second drive arm 282 to move above a second optical scale 294. Data provided as an output of sensor 292 is also fed along a line 293 to an input port of the computing system 255 which uses an algorithm to determine the actual position of second drive arm 282 in the directions indicated by arrow 284.

Referring to FIGS. 4 and 5, drive link 206 is pivotally mounted on second drive arm 282 by means of bearings 296 in drive link 206, bearings 298 in second drive arm 282, and a shaft 300 extending through the bearings 296, 298. Drive link 206 is also pivotally mounted on a connecting link 302 by means of bearings 304 in drive link 206, bearings 306 in connecting link 302, and a shaft 307 extending through the bearings 304, 306.

Referring again to FIGS. 4 and 7, connecting link 302 is also pivotally mounted on first drive arm 210 by means of bearings 308 in connecting link 302, bearings 310 in first drive arm 210, and a shaft 312 extending through the bearings 308, 310.

Continuing to refer to FIGS. 4 and 7, and referring as well to FIG. 5, bonding wire 76 is supplied to wirebonding assembly 10 from a spool 314 turning with a spindle 316 on stationary shaft 260. This wire 76 is fed over a tensioning pulley 318, and an idler pulley 320, which is rotatably mounted on a bracket 321 extending upward from driving arm 206. Tensioning pulley 318 is rotatably mounted on a pin 322 extending upward from a tensioning crank 324, which is in turn pivotally mounted on second drive arm 282 by means of a rivet 326. An extension spring 328 applies a torque to tensioning crank 324, which in turn applies a force to tensioning pulley 318 to maintain tension in the bonding wire 76 as the wirebonding assembly 10 is moved. The spindle 316 is held downward, against a spring washer 330, by means of a nut 332 and locknut 334, engaging a threaded portion 336 of stationary shaft 260. Spring washer 330, which is centrally attached to stationary shaft 260, applies a retarding torque to the lower surface of spindle 316, so that cable tensioning can be applied through tensioning pulley 318.

Since the tensioning force developed in bonding wire 206 through tensioning pulley 318 is lower than the force required to turn spindle 316 through spool 314, pulling the wire 76 extending partly around pulley 318 in the direction of arrow 338 results in the rotation of tensioning crank 324 in the direction of arrow 340 until the crank 324 rests against a motion stopping tab 342 extending upward from second drive arm 262. After contact occurs between crank 324 and tab 342, continued movement of the bonding wire 76 extending partly around pulley 318 results in additional wire being pulled off spool 314. Movement of the bonding wire 76 extending partly around pulley 318 in the direction opposite arrow 338 results in the movement of tensioning crank 324 opposite the direction of arrow 340, being pulled by extension spring 226 to maintain tension in the bonding wire 76.

Referring again to FIGS. 4 and 5, a clamping mechanism 344, for clamping bonding wire 76 so that it can be broken by movement of bonding assembly 10, as generally described above in reference to FIG. 2, is also attached to drive link 206 by means of bracket 321. The clamping mechanism 344 includes an iron "L"-shaped frame member 346, a cylindrical iron core 348, a coil 350 over the core 348, and an armature 352 pivotally mounted at a pin 354 extending upward from the bracket 321. When electrical current is not flowing through coil 350, an extension spring 356 holds armature 352 pivoted in the direction of arrow 358, out of contact with the bonding wire 76. When electrical current is driven through coil 350, armature 352 is attracted to move in the direction opposite arrow 358, clamping the bonding wire 76 against an anvil surface 360 of bracket 321. The anvil surface 360 may include a groove through which the wire 76 extends.

In operation, the wirebonding assembly 10 is moved generally as described above (for wirebonding assembly 10) with reference to FIG. 2. For each angular position of first drive arm 210, as determined by the output of sensor 274, together with an angular position of second of second drive arm 282, as determined by the output of sensor 292, the wirebonding assembly 10 is placed in at a unique point in a horizontal plane extending perpendicularly to arrow 230. The computing system 255 executes an algorithm determining the position of the wirebonding assembly 10 as a function of the angular positions determined from the outputs of sensors 274 and 292. Computing system 255 also accesses a list of coordinates describing the locations to which wirebonding assembly 10 must be moved in sequence to perform the wirebonding operations desired on a circuit chip, such as circuit chip 74 of FIG. 2, going through the wirebonding process. The algorithm calculates the difference between the actual location of the wirebonding assembly 10 and where it should be to perform the desired wirebonding operations and determines the levels of current to apply to first drive motor 208 and to second drive motor 280 to bring wirebonding assembly 10 into the desired position. These currents are applied through amplifiers 362 and 364, respectively, each of which is connected to an output port of the computing system 255.

When wirebonding assembly 10 is thus positioned as needed for a wirebonding operation, current is driven through coil 232 of linear motor 204 to lower the assembly 10. As the wirebonding operation occurs, a continued flow of current through coil 232 maintains the downward pressure needed for bonding. When an individual wirebonding operation is completed, wirebonding assembly 10 is allowed to rise according to the upward force provided by extension spring 256. Alternately, this spring force may be aided by reversing the direction of current flow through the coil 232. The current used to drive linear motor 204 is supplied as an output of amplifier 366, which is also connected to an output port of computing system 255.

When the bonding wire 76 is to be broken by movement of wirebonding assembly 10, again as described above in reference to FIG. 2, a magnet driver 368 connected to another output port of computing system drives electrical current through coil 350 of clamping mechanism 344, so that bonding wire 76 is clamped against anvil 360 as the wirebonding assembly 10 moves away from the spot at which a wire bond has been made.

FIG. 8 is a partial isometric view of the apparatus previously described in reference to FIGS. 4–7, together with an indexing chip carrier 376 driven in the direction of arrow 378 in an intermittent fashion by chip carrier drive motor 380. As previously described, the linear motor 204 drives a slider 12, to which wirebonding assembly 10 is attached, upward, in the direction indicated by arrow 82, or downward, in an engagement direction opposite the direction of arrow 82. The drive arm 206 is moved in directions perpendicular to the direction of arrow 82, in order to move the wirebonding assembly 10 among various points at which wirebonding operations are to occur.

The chip carrier 376 includes a number of slots 382, in which circuit chips, such as circuit chip 74 of FIG. 2, are loaded for wirebonding. Each slot 141 is configured to hold a circuit chip tightly, with alternate means (not shown), such as dowel pins, clamps, or springs, specific to the type of circuit chip, being provided to hold the chip accurately in position on the chip carrier 376. The movement of chip carrier 376 is controlled so that each individual circuit chip remains in position for wirebonding with the apparatus 10 during the wirebonding operations, with an adjacent circuit chip subsequently being moved into this position by an indexing movement of the carrier 376.

Thus, a significant advantage over wirebonding apparatus of the prior art is achieved by providing movement of the wirebonding apparatus of the present invention among the various points on a single circuit chip at which wirebonding is to occur. An independent, indexing movement is used to supply individual circuit chips to the wirebonding process. Unlike the prior art processes, except to supply different, individual chips for wirebonding, the chips are not moved. In this way, the movement of chips is made convenient for the manufacturing process. For example, batch loading and unloading may be used, with the chip carrier 376 being loaded with a number of circuit chips to begin the process, and with the same number of circuit chips being unloaded following completion of the process. Alternately, chip carrier 376 may be loaded with individual chips from a conveying system.

FIG. 9 is an isometric view of a first alternative bonding tip 386, shown in an exploded relationship with the piezoelectric actuator 14, to which it is attached. The surface of proximal end 388 of bonding tip 386 fits against the surface of distal end 38 of actuator 14, being adhesively cemented thereto, so that a bond is formed without the upward-extending segments 48 of bonding tip 18 (shown in FIG. 1). A slot 390, extending perpendicularly to the directions of vibration, as indicated by arrow 40, of the distal end 38 of actuator 14, interrupts the surface of proximal end 388 of bonding tip 386, allowing for the warping of distal end 38 of actuator 14 with ultrasonic vibrations. The general shape of bonding tip 386 is that of a truncated cone, whereas the general shape of bonding tip 18 (shown in FIG. 1) is that of a truncated pyramid. An axial hole 392 extends through bonding tip 386, allowing the passage of bonding wire 76 (shown in FIG. 2) therethrough.

FIG. 10 is an isometric view of a second alternative bonding tip 394, also shown in an exploded relationship with the piezoelectric actuator 14, to which it is attached. Axial hole 396 includes a counterbored and threaded upper portion 398, engaging a screw 400, which holds a formed clamp 402 in place. Upstanding curved tabs 404 of clamp 402 engage a distal portion of the inner surface 22 of actuator 14, being preferably also cemented thereto. Again, a slot 406 is provided, extending between tabs 464 in a direction perpendicular to the directions of vibration indicated by arrow 40.

Figure 11:
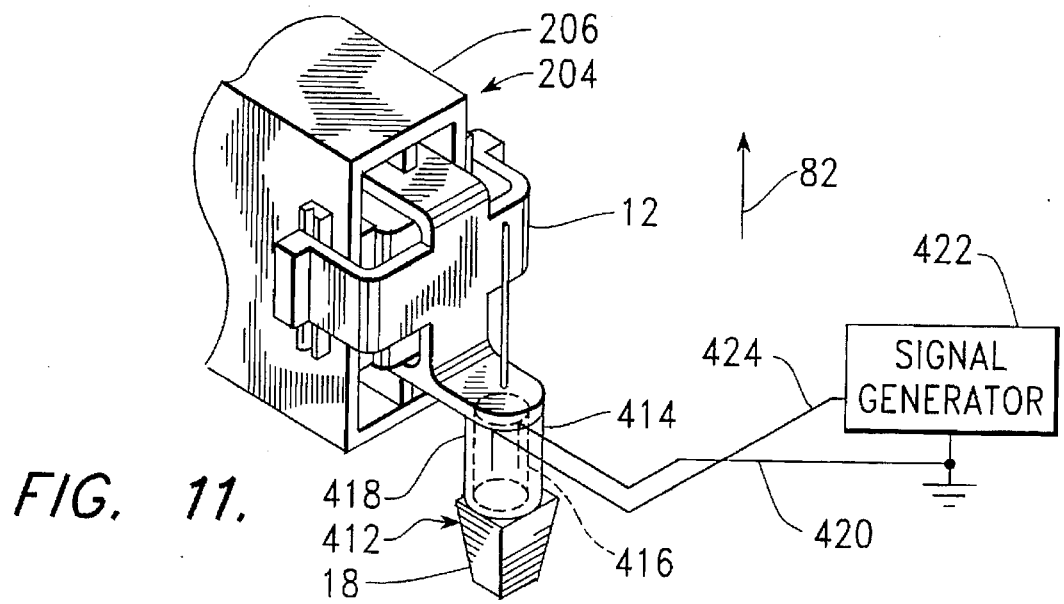
FIG. 11 is a partial isometric view of the apparatus of FIG. 4, with an ultrasonic wirebonding assembly including an alternative piezoelectric tube actuator.

FIG. 11 is a partial isometric view of the apparatus previously described in reference to FIGS. 4–7, together with a wirebonding apparatus 412 including an alternative piezoelectric tube actuator 414. As previously described, the linear motor 204 drives a slider 12, to which the wirebonding assembly 414 is attached, upward, in the direction indicated by arrow 82, or downward, in an engagement direction opposite the direction of arrow 82. The drive arm 206 is moved in directions perpendicular to the direction of arrow 82, in order to move the wirebonding assembly 10 among various points at which wirebonding operations are to occur.

This alternative actuator 414 is a piezoelectric tube having an internal conductive surface 416 and an outer conductive surface 418. The inner conductive surface 416 is connected to electrical ground by an actuator grounding wire 420, and the outer conductive surface 418 is connected to the output of a signal generator 422 by actuator driving wire 424. With this configuration, the application of a negative voltage to the outer conductive surface 418 increases the length of actuator 414, moving a bonding tip 18 attached to the distal end thereof in an engagement direction, opposite the direction of arrow 82. The application of a positive voltage to the outer conductive surface 418 decreases the length of actuator 414. When the output of signal generator 422, consisting of voltage fluctuations at the desired ultrasonic frequency, is applied to the outer conductive surface 418, bonding tip 18 vibrates at this frequency in and opposite to the direction indicated by arrow 82. Bonding wire 76 is fed through the actuator 414 and the bonding tip 18, and the ultrasonic bonding apparatus of FIG. 11 is moved among the various points at which ultrasonic bonds are to be made, generally as previously discussed in reference to FIGS. 2 and 4–7.

Figure 12:
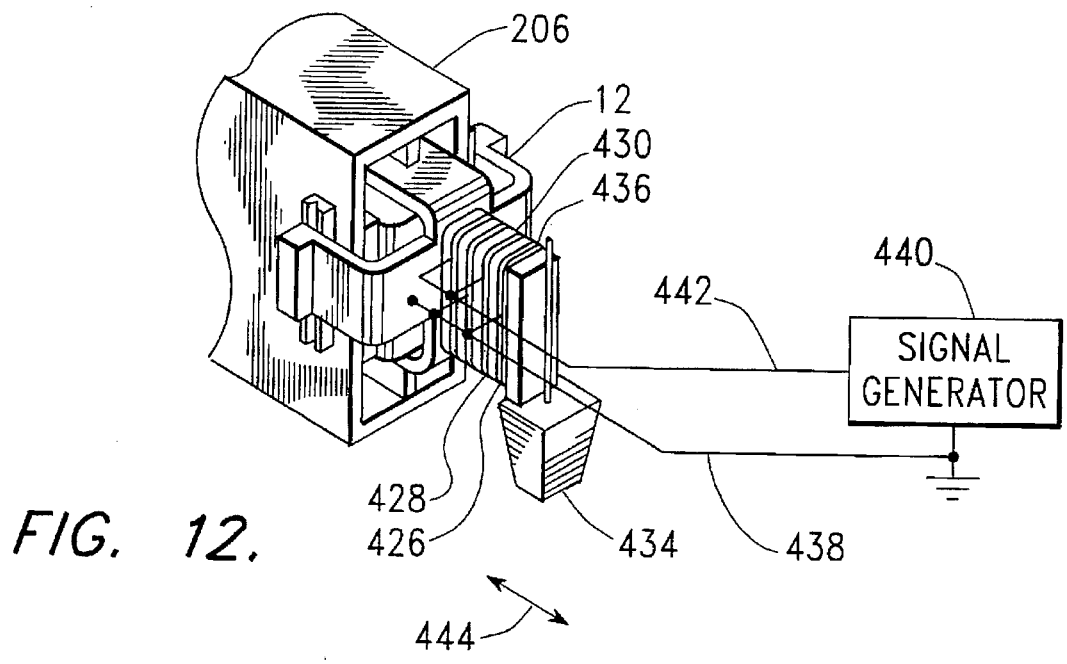
FIG. 12 is a partial isometric view of the apparatus of FIG. 4, with an ultrasonic wirebonding assembly including a stacked piezoelectric actuator.

FIG. 12 is a partial isometric view of the apparatus previously described in reference to FIGS. 4–7, together with a wirebonding apparatus 426 including an stacked piezoelectric actuator 428. Again, the motion of drive arm 206 and slider 12 is as previously discussed in reference to FIGS. 2 and 4–7.

This actuator 428 includes a number of piezoelectric elements 430 stacked between an outward-facing surface of slider 12 and an upward-extending tab 432 of bonding tip 434. An electrode 436 is cemented between each adjacent piezoelectric element 430, with alternating electrodes 436 being attached to electrical ground through a line 438, or to the output of a signal generator 440 by a line 442. In this way, the electrical signal produced by signal generator 440 is applied across each piezoelectric element 430, producing a change in the thickness of the element 430. Because these elements 430 are stacked, these changes in the width of elements accumulate, causing motion of the tip 434 in the directions of arrow 444. Again, the signal generator 440 produces an electrical output signal at the desired frequency for ultrasonic vibration.

It is also understood that, within the scope of the present invention, the mechanism for moving an ultrasonic wirebonding assembly discussed above may be applied to other forms of wirebonding assembly known to those familiar with the art.

While the invention has been described in its preferred forms or embodiments with some degree of particularity, it is understood that this description has been given only by way of example and that numerous changes in the details of construction, fabrication and use, including the combination and arrangement of parts, may be made without departing from the spirit and scope of the invention.

What is claimed is:

1. Apparatus for performing wirebonding operations on circuit chips, wherein said apparatus comprises:
    a first drive arm mounted to pivot about a first stationary pivot axis;
    a second drive arm mounted to pivot about a second stationary pivot axis, wherein said second stationary pivot axis is parallel to said first stationary pivot axis;
    a linkage extending between said first and second drive arms, wherein said linkage is pivotably attached to said first and second drive arms, allowing said second drive arm to move independently from said first drive arm;
    a wirebonding assembly mounted on said linkage, wherein pivoting movement of said first drive arm and pivoting movement of said second drive arm each effect movement of said wirebonding assembly;
    first drive means for pivoting said first drive arm about said first stationary pivot axis; and
    second drive means for pivoting said second drive arm about said second stationary pivot axis.

2. The apparatus of claim 1, wherein said linkage includes:
    a drive link pivotably mounted on said second drive arm, with said wirebonding assembly mounted on said drive link; and
    a connecting link pivotably mounted at a first end on said first drive arm and at a second end on said drive link.

3. The apparatus of claim 2, wherein said first and second stationary pivot axes are coaxial with one another, with said first and second drive arms being mounted on a stationary pivot shaft.

4. The apparatus of claim 3:
    wherein said first drive means includes a first permanent magnet extending as a first arc partially around said stationary shaft, a first coil extending around said first permanent magnet, moving with said first drive arm along said first permanent magnet, and first circuit means for driving electrical current through said first coil; and
    wherein said second drive means includes a second permanent magnet extending as a second arc partially around said stationary shaft, a second coil extending around said second permanent magnet, moving with said second drive arm along said second permanent magnet, and second circuit means for driving electrical current through said second coil.

5. The apparatus of claim 3:
    wherein said wirebonding assembly is mounted to slide on said drive link in and opposite an engagement direction parallel said first pivot axis; and
    wherein said apparatus additionally comprise engagement drive means for moving said wirebonding assembly in and opposite said engagement direction.

6. The apparatus of claim 5:

wherein said engagement drive means includes:

a permanent magnet attached to a magnet frame;

an engagement coil movable along a section of said magnet frame in and opposite to said engagement direction, with said wirebonding assembly being attached to move with said coil; and third circuit means for driving electrical current through said engagement coil.

7. The apparatus of claim 5:

wherein said wirebonding assembly includes an ultrasonic transducer and a bonding tip, with said ultrasonic transducer causing said bonding tip to vibrate at an ultrasonic frequency; and wherein said apparatus additionally comprises wire feeding means for supplying a bonding wire to said bonding tip.

8. The apparatus of claim 7, wherein said wire feeding means includes:

a spool containing said bonding wire;

a path for wire extending from said spool to said bonding tip, wherein said path includes a spring biased idler pulley maintaining tension in said bonding wire; and braking means retarding rotation of said spool.

9. The apparatus of claim 1, comprising additionally:

conveying means for moving a plurality of said circuit chips in an incremental motion past said wirebonding assembly; and conveyor drive means moving each of said circuit chips into a workspace adjacent said wirebonding assembly and holding each of said circuit chips within said workspace as wirebonding operations are performed.

10. The apparatus of claim 7, wherein said conveying means includes a number of holders extending along a line, with each said holder including surfaces engaging one of said circuit chips.

* * * * *